(12) United States Patent
Hou et al.

(10) Patent No.: US 10,168,799 B2
(45) Date of Patent: Jan. 1, 2019

(54) HYBRID DIGITAL ANALOG KEY SWITCH

(71) Applicant: UNEO INC., Taipei (TW)

(72) Inventors: Chih-Sheng Hou, Taipei (TW);
Han-Ying Lei, Taipei (TW);
Hsuan-Hao Tsai, Taipei (TW)

(73) Assignee: UNEO Inc., Taipei (TW)

( * ) Notice: Subject to any disclaimer, the term of this patent is extended or adjusted under 35 U.S.C. 154(b) by 0 days.

(21) Appl. No.: 15/646,268

(22) Filed: Jul. 11, 2017

(65) Prior Publication Data

US 2018/0107284 A1    Apr. 19, 2018

Related U.S. Application Data

(60) Provisional application No. 62/408,982, filed on Oct. 17, 2016.

(51) Int. Cl.
| | | |
|---|---|---|
| *H01H 13/702* | (2006.01) | |
| *G06F 3/02* | (2006.01) | |
| *H03K 17/975* | (2006.01) | |
| *H01H 13/7065* | (2006.01) | |

(52) U.S. Cl.
CPC ......... *G06F 3/0202* (2013.01); *H01H 13/702* (2013.01); *H01H 13/7065* (2013.01); *H03K 17/975* (2013.01); *H01H 2215/004* (2013.01); *H01H 2225/03* (2013.01)

(58) Field of Classification Search
CPC .................................................... G06F 3/0202
USPC ........................................................... 340/34
See application file for complete search history.

(56) References Cited

U.S. PATENT DOCUMENTS

| | | | |
|---|---|---|---|
| 2010/0148999 A1* | 6/2010 | Casparian | G06F 3/0202 341/34 |
| 2014/0132522 A1* | 5/2014 | Bowen | G06F 3/0234 345/168 |
| 2016/0049264 A1* | 2/2016 | Muller | H01H 13/20 200/345 |

* cited by examiner

*Primary Examiner* — Qutbuddin Ghulamali
(74) *Attorney, Agent, or Firm* — Hauptman Ham, LLP

(57) ABSTRACT

A hybrid digital analog key switch is designed to generate both a digital signal and an analog signal (DA) from a single key switch after the key is depressed. A pair of spring metal electrodes are electrically coupled to up and down movement of the key stem, and a force sensor is configured on a bottom side of the key module. Both a digital signal and an analog signal are generated when the key is depressed by a user.

21 Claims, 10 Drawing Sheets

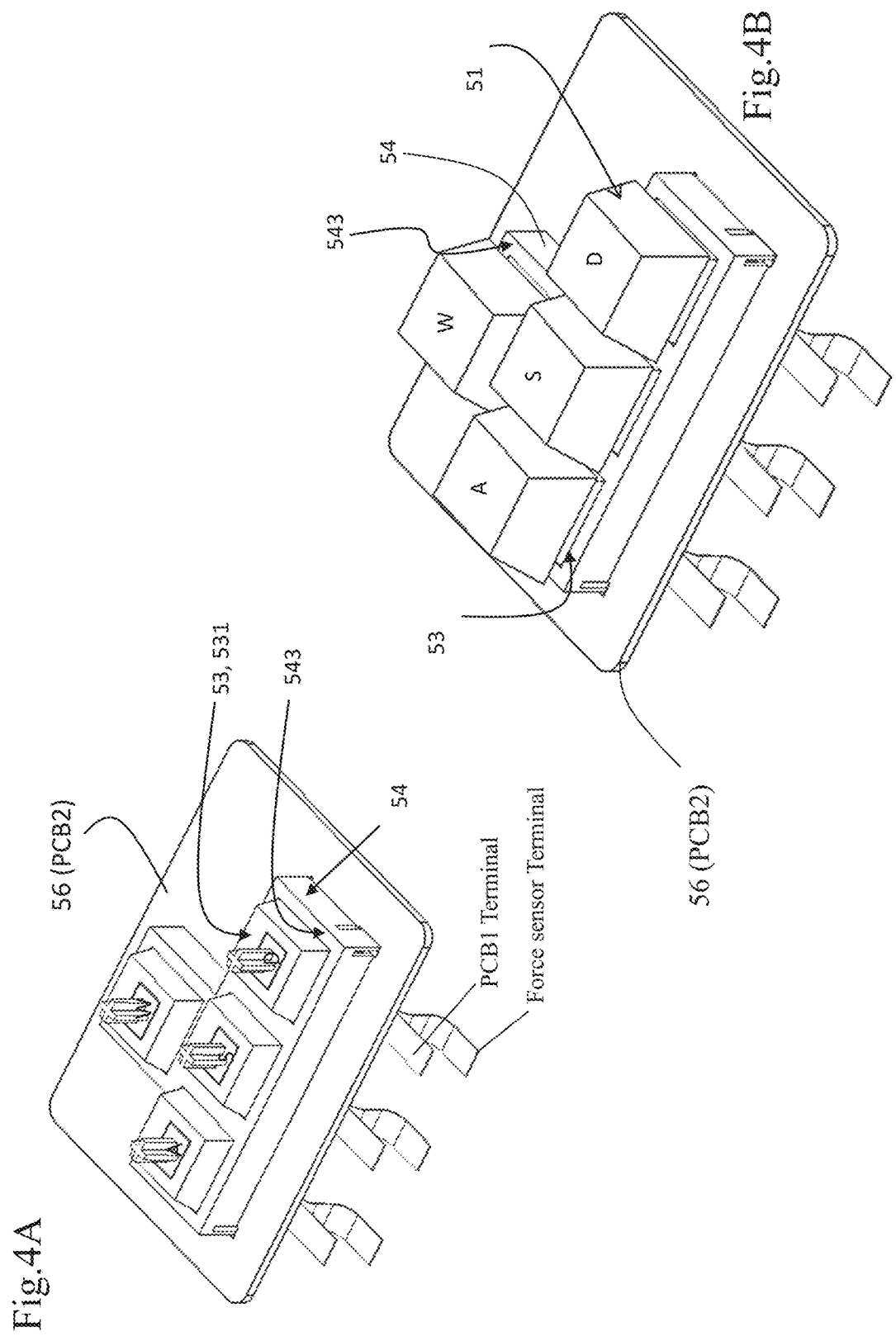

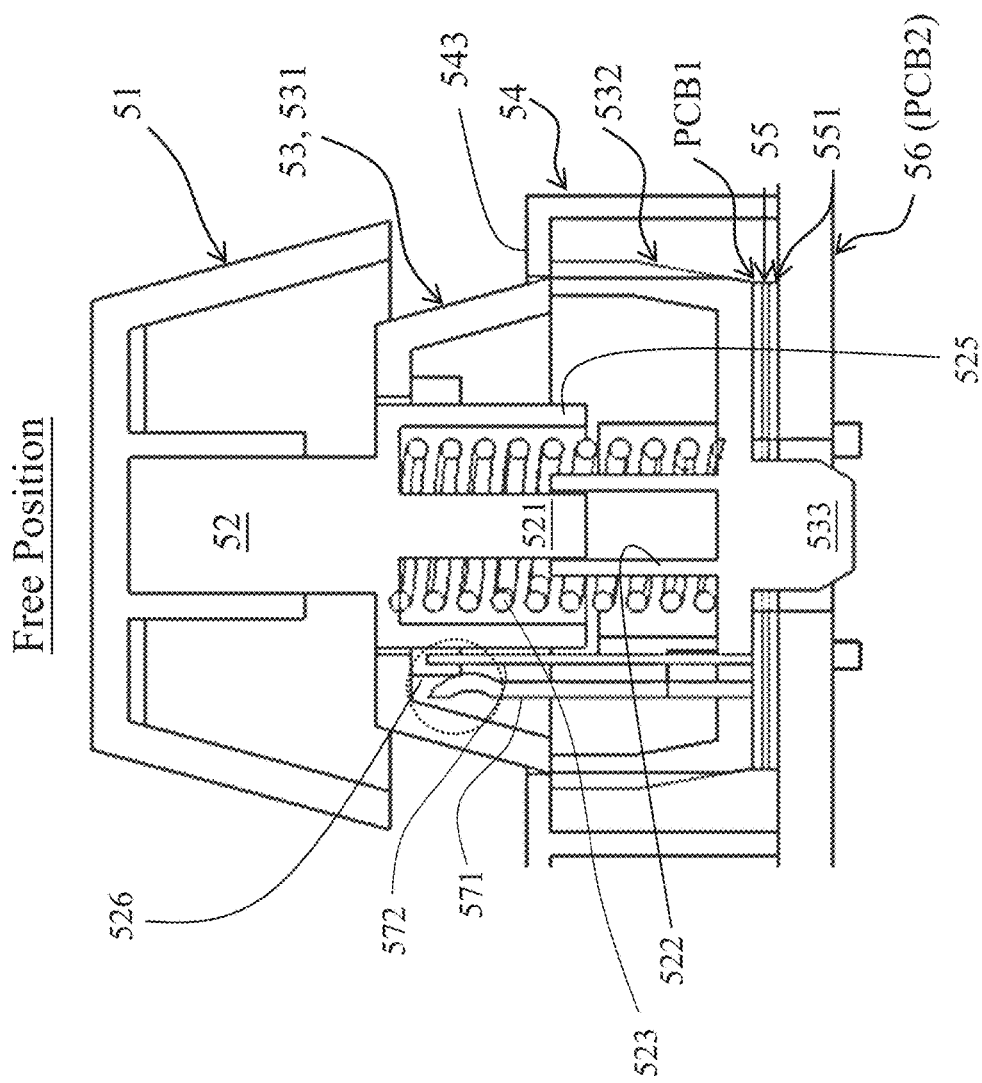

HYBRID DIGITAL ANALOG KEY SWITCH

RELATED APPLICATIONS

The present application claims the benefit of U.S. Provisional Application No. 62/408,982, filed Oct. 17, 2016, the disclosure of which is hereby incorporated by reference herein in its entirety.

BACKGROUND

Technical Field

The present invention relates to a key switch, especially relates to a hybrid digital analog key switch to generate both a digital signal and an analog signal (DA) from a single key switch after being depressed.

Description of Related Art

FIG. 1 is a prior art

FIG. 1 is a prior art US2010/0148999 which disclosed separate keys for outputting a digital signal and an analog signal in a keyboard. The prior art discloses an analog key 202 and a digital key 203. In operation, depressing the analog key cap 51 202 shall cause an analog signal output 220, and depressing digital key cap 51 203 shall cause a digital or on/off output 222. The analog key provides a variable output, and the digital key provides a momentary-on output. A plastic base 212 supports the key structure. A flexible PCB (circuit board) 210 is provided on top of the base 212. The PCB 210 includes circuit traces or connections that provide for electrical signals to be generated and communicated when keys are depressed. Circuit connection 236 is used to provide digital output 222, and circuit connection pads 230 and 231 are used to provide the analog output 220. The next layer is a flexible insulator 208, such as a flexible PCB without circuit connections. The next layer is another flexible PCB 206 that includes circuit traces or connections that work in conjunction with the connections on PCB 210 to provide for electrical signals to be generated and communicated when keys are depressed.

A relatively thin flexible layer 204 is provided above PCB 206. A flexible dome 215 is provided for analog key cap 51 202, and flexible dome 213 is provided for digital key cap 51 203. For the digital key, an actuator 214 is provided underneath the dome 213 that causes circuit trace 234 to be engaged with circuit trace 236 when the digital key cap 51 is depressed. When circuit trace 234 touches the circuit trace 236, a digital output 222 is provided. For the analog key, a conductive and flexible half-dome 216 is provided that flexes when depressed. The capacitance associated between circuit pad 231 and circuit pad 230 varies when analog key cap 51 is depressed. Essentially pad 231 and pad 230 are the two plates of a capacitor. The variable capacitance between these two plates is measured from signal trace 232 by sending this trace to capacitance reading circuitry.

The dedicated key design is not a convenient control device for a game player. A more favorable control device capable of outputting both a digital signal and an analog signal device needs to be devised.

BRIEF DESCRIPTION OF THE DRAWINGS

FIGS. 4A~4B shows an assembly of the key switch in three dimensional view.

FIG. 5 shows a section view of a hybrid DA key switch in a normal position, non-depressed, according to the present invention.

DETAILED DESCRIPTION OF THE INVENTION

A hybrid digital analog key switch is designed to generate both a digital signal and an analog signal (DA) from a single key switch after the key being depressed. A pair of spring metal electrodes are electrically coupled to up and down movement of the key stem, and a force sensor is configured on a bottom side of the key module. Both a digital signal and an analog signal are generated when the key is depressed by a user.

Figure 1:
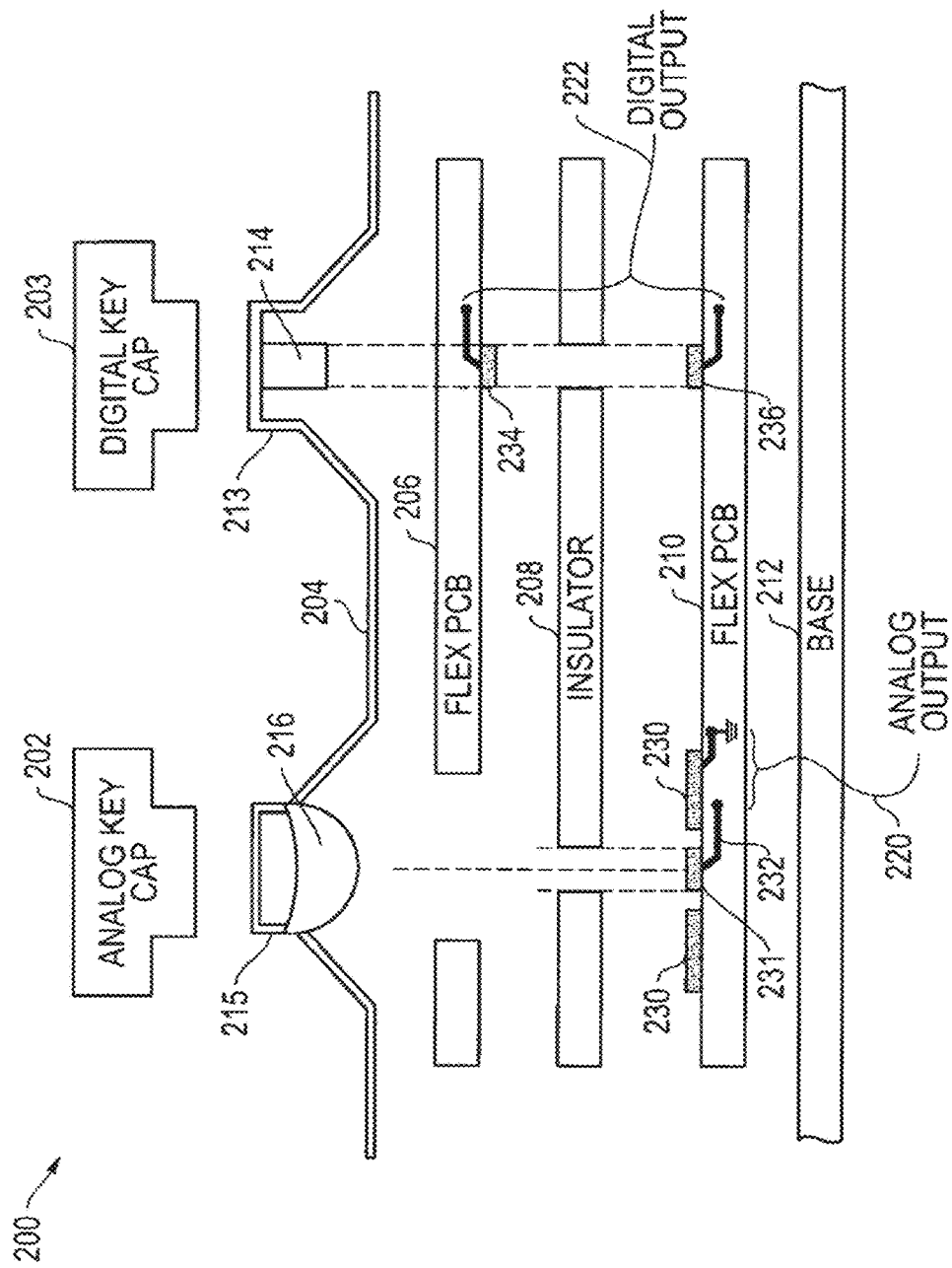
FIG. 1 is a prior art
Figure 2:
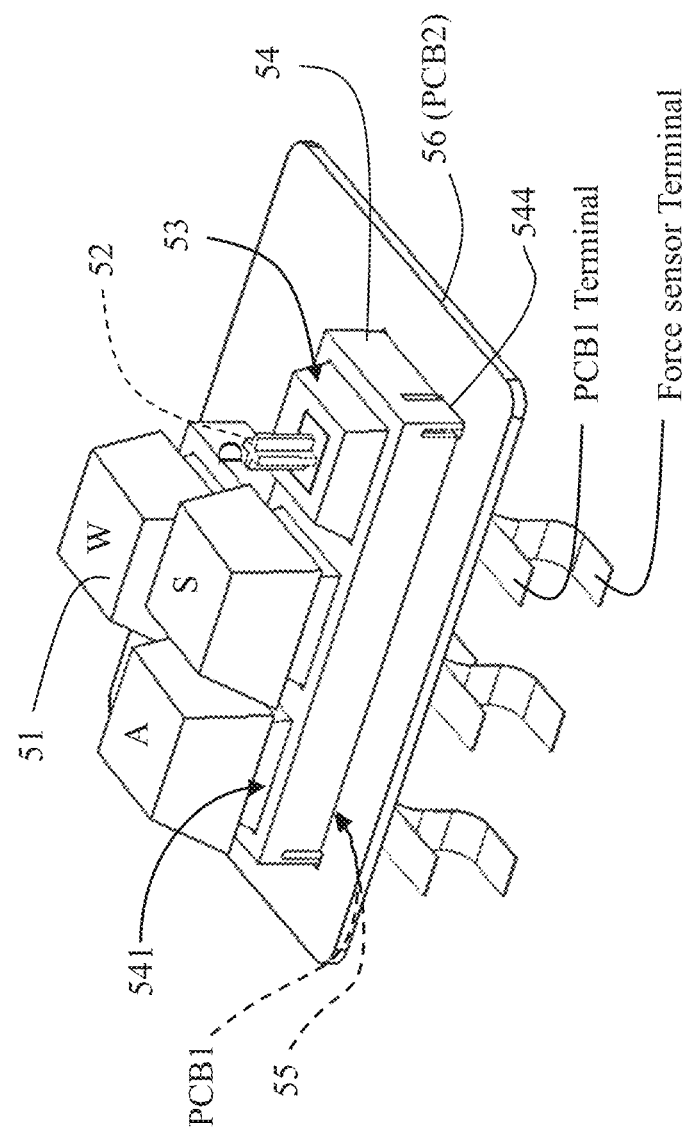
FIG. 2 shows a hybrid DA key switch according to the present invention.

FIG. 2 shows a hybrid DA key switch according to the present invention.

FIG. 2 shows an outline of the hybrid DA key switch according to the present invention. Four hybrid DA key switches W, A, S, D are exemplified.

According to the present invention, each hybrid DA key switch comprises: a key cap 51 configured on top, a key stem 52 configured on a bottom side of the key cap 51, a key module 53 configured on a bottom side of the key cap 51, the key module 53 is mechanically coupled to the key cap 51 through the key stem 52. A key frame 54 comprises a plurality of through cells 541, each the through cell 541 is enclosed by four cell walls 542, each through cell 541 is configured to house a corresponding one key module 53. A first printed circuit board PCB1 and a force sensor 55 are configured on a bottom side of the key module 53. A support plate 56, which could be a second printed circuit board PCB2 or a mechanical part, is configured on a bottom side of the key frame 54. The first printed circuit board PCB1 has a terminal extended beyond the key frame 54 for electrically coupling to a control circuit (not shown), and the force sensor 55 has a terminal extended beyond the key frame 54 for electrically coupling to the control circuit (not shown).

FIGS. 3A~3E shows an exploded view for the hybrid DA key switch according to the present invention.

Figure 3A:
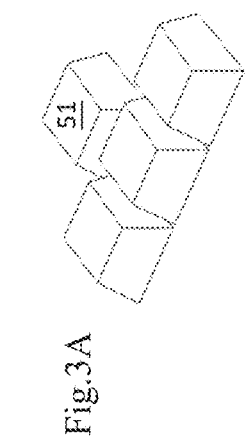
FIGS. 3A~3E shows an exploded view for the hybrid DA key switch according to the present invention.

FIG. 3A shows that four key caps 51 are being prepared. Each key cap 51 shall be mounted on a top side of a corresponding key stem 52 in a later process.

Figure 3B:
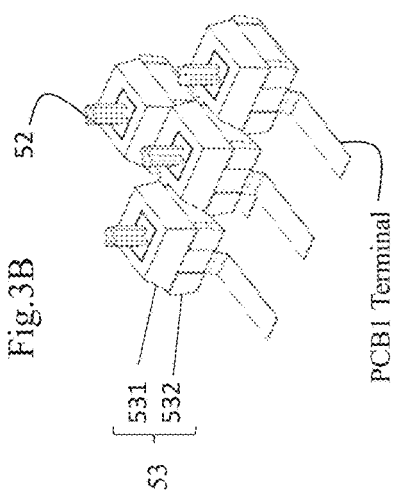

FIG. 3B shows a key module 53 which shall be configured on a bottom side of the key cap 51. The key module 53 comprises a key module cover 531 and a key module base 532. A key stem 52 is protruded upwards from the key module 53 and mechanically coupled to the key cap 51. A printed circuit board PCB1 is configured on a bottom side of the key module 53 with a PCB terminal extended outside of the key module 53 for electrically coupling to a control circuit (not shown).

Figure 3C:
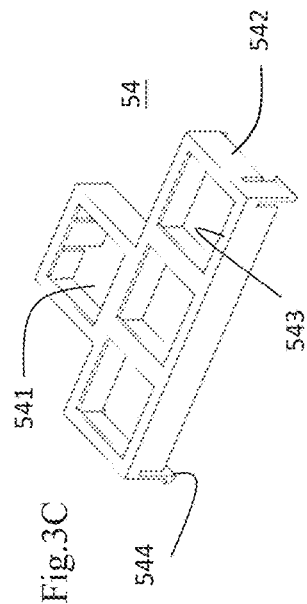

FIG. 3C shows that a key frame 54 shall be configured on a bottom side of the key cap 51. The key frame 54 comprises a plurality of through cells 541, each through cell 541 is designed for housing a key module base 532 of a corresponding key module 53. Each through cell 541 is enclosed by four cell walls 542, a top ledge 543 is configured on a top end of each cell wall 542 for bracket a top end of a corresponding module base 532. A plurality of fastening buckles 544 is configured on a bottom side of the key frame 54 for fixing the key frame 54 onto a support plate 56 (FIG. 3E) so that the key module 53 can be fixed in position.

Figure 3D:
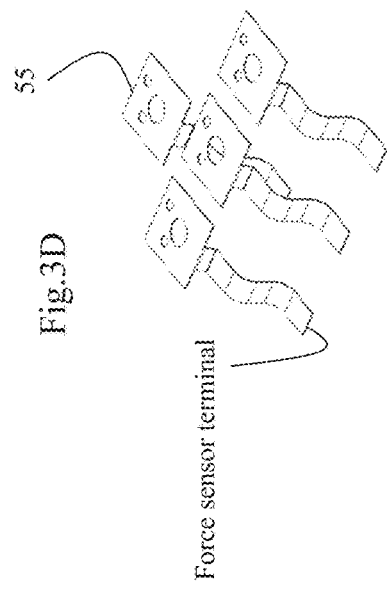

FIG. 3D shows that four force sensors 55 are prepared and shall be configured on a bottom side (or top side) of the printed circuit board PCB1 in a later process. The force sensor 55 generates a pressure signal responding to a pressure coming from top side when the key switch is pressed down by a user's finger. The pressure signal is positively related to a magnitude of the force exerted by the user's finger.

Figure 3E:
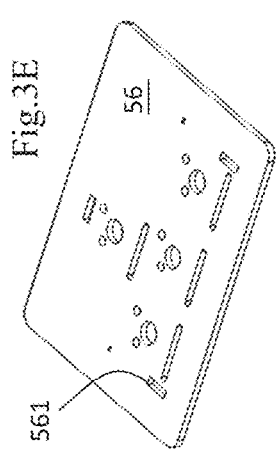

FIG. 3E shows that a support plate 56 can be a printed circuit board PCB2 or a mechanical part. The support plate 56 be configured on a bottom side of the key frame 54 in a later process. The support plate 56 has a plurality of through holes 561 for coupling to the fastening buckles 544 of the key frame 54, so that the key frame 54 can be fixed onto the support plate 56.

FIGS. 4A~4B shows an assembly of the key switch in three dimensional view.

FIG. 4A shows that the key frame 54 is fixed on a top side of the support plate 56. Each key module 53 is configured in a corresponding through cell 541 of the key frame 54 with the module cover 531 exposed on a top side of the key frame 54, and each key module base 532 is bracket under the top ledge 543 of the key frame 54. Each top ledge 543 of a side wall 542 of the through cell 541 brackets the top side of a corresponding side wall of the key module base 532 seated in the through cell 541. Each key stem 52 protrudes upwards from the key module cover 531 for a corresponding key cap 51 to mount thereon.

FIG. 4B shows that a plurality of key caps 51 is prepared. Each key cap 51 is configured on a top end of a corresponding key stem 52.

FIG. 5 shows a section view of a hybrid DA key switch in a normal free position, non-depressed, according to the present invention.

FIG. 5 shows a section view of the hybrid DA key switch. The key cap 51 can be restorably depressed relatively to the key module 53; in other words, the key cap 51 with the key stem 52 moves down according to a user finger's depression, and the key cap 51 with the key stem 52 moves back up after the user finger's releasing.

The key stem 52 has a central axis 521 configured on bottom. The central axis 521 is fitted in a sleeve 522 and can move up and down with respect to the sleeve 522 according to user's release or depression of the key switch.

A coil spring 523 is configured around the sleeve 522 to push the key stem 52 upwards. A circular wall 525 is configured on a bottom side of the key stem 52 and surrounds the central axis 521. A nonconductive separator 526 is configured on an outside surface of the circular wall 525. The nonconductive separator 526 is configured to electrically separate the first spring electrode 571 and the second spring electrode 572 when the key switch is in a free position, i.e. not depressed by a user's finger.

Figure 7:
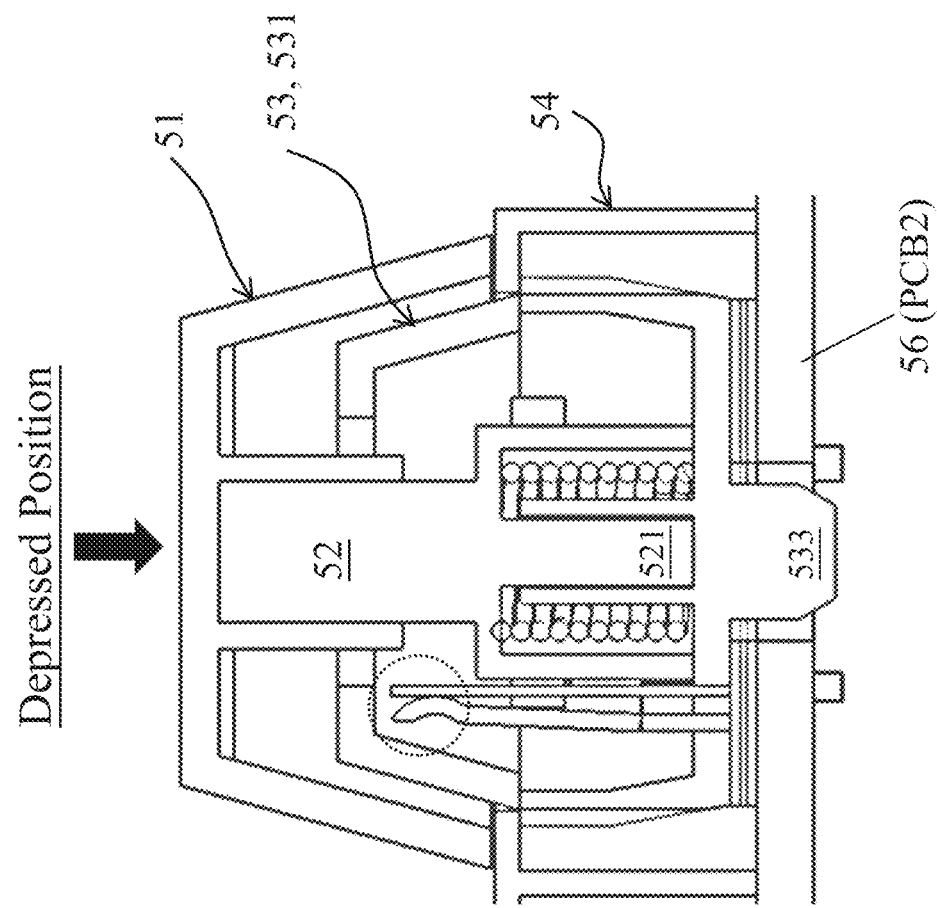
FIG. 7 shows a section view of a hybrid DA key switch in a depressed position according to the present invention.

The first metal spring electrode 571 and the second metal spring electrode 572 are configured upwards and extend into a space enclosed by the key module 53. The pair of metal spring electrodes 571, 572 is mechanically coupled to up and down movement of the key stem 52. The two metal spring electrodes 571, 572 are circuit opened and separated by the nonconductive separator 526 when the key switch is in a normal position, non-depressed situation. However, the two metal spring electrodes 571, 572 are touched, circuit shorted, when the nonconductive separator 526 moves downwards when the hybrid DA key is depressed (FIG. 7).

Figure 6A:
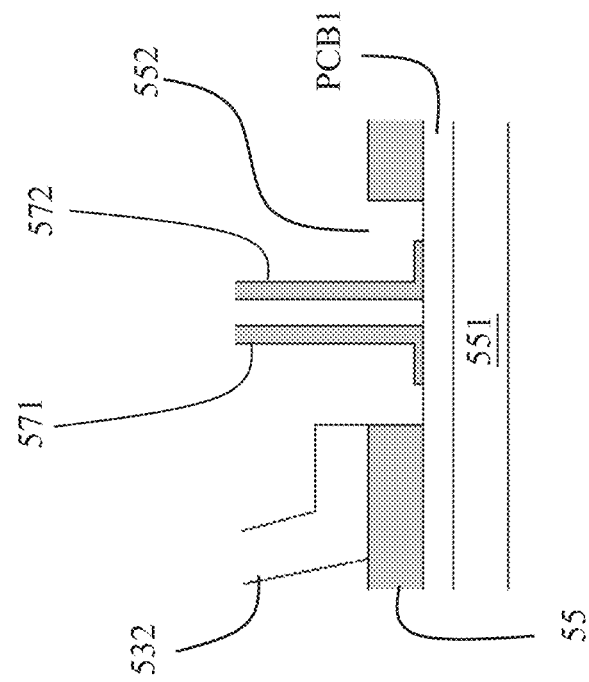
FIG. 6A~6B show the metal spring electrodes in a surface mount configuration.

The key module base 532 has optionally configured a bottom protrusion 533 to fix in a corresponding through hole passing through the support plate 56, so that the key module 53 can be in a fixed position with reference to the support plate 56. In the figure, the rubber sheet 551 is configured on a bottom side of the force sensor 55 (FIG. 6A). However in another embodiment, the rubber sheet 551 is configured on a bottom side of the first printed circuit board PCB1 (FIG. 6B).

The two spring electrodes 571, 572 are normally open when the key switch is not depressed. At this moment, the Digital Signal is off, and the Analog Signal displays a Baseline Signal.

Figure 6B:
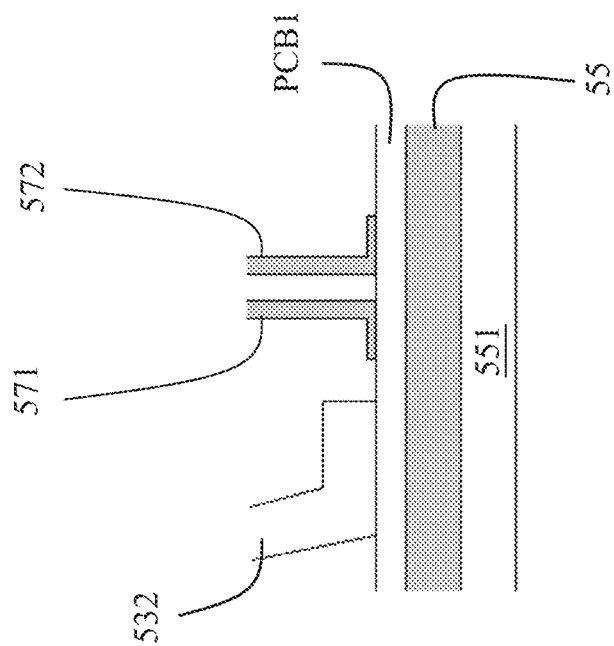

FIG. 6A~6B show the metal spring electrodes in a surface mount configuration.

FIG. 6A shows that the pair of metal spring electrodes 571, 572 are surfaced mounted onto the first printed circuit board PCB1. The force sensor 55 is configured on a bottom side of the first printed circuit board PCB1. The rubber sheet 551 is configured on a bottom side of the force sensor 55.

FIG. 6B shows that the force sensor 55 can be configured at a top side of the first printed circuit board PCB1 with a central opening 552 for exposing the underlined printed circuit board PCB1, so that the two metal spring electrodes 571, 572 can be electrically coupled to the first printed circuit board PCB1.

FIG. 7 shows a section view of a hybrid DA key switch in a depressed position according to the present invention.

FIG. 7 shows that the two metal spring electrodes 571, 572 are shorted after the nonconductive separator 526 moves downwards when the hybrid DA key is depressed by a user's finger. A digital signal is generated when the two metal spring electrodes 571, 572 touch.

Meanwhile since the force sensor 55 is configured on a bottom side of the key module 53, a pressure is sensed by the force sensor 55 when the key module 53 is move downwards, a pressure signal is generated from the force sensor 55.

The two metal spring electrodes 571, 572 are electrically coupled to the first printed circuit board PCB1. The metal spring electrodes can be electrically coupled to the first printed circuit board PCB1 through surface mount or through-hole soldering.

The force sensor 55 can be configured on a top side of the first printed circuit board PCB1. Alternatively the force sensor 55 can be configured on a bottom side of the first printed circuit board PCB1.

A rigid support plate 56, which can be a second printed circuit board PCB2, or a rigid mechanical part, is configured on the bottom side of the key switch. The support plate 56, in combination with the key frame 54, is configured to maintain a constant position for the key module 53 and thereafter maintain a constant position for the whole key switch horizontally.

The rubber sheet 551 is optionally adopted. The rubber sheet 551 is configured on a bottom side of the first printed circuit board PCB1 or configured on a bottom of the force sensor 55 depending on whichever is a bottom layer among the stack of the first printed circuit board PCB1 and the force sensor 55.

The rubber sheet 551 is configured for absorbing parts dimensional tolerance in thickness direction, and/or to generate a slight preload against the force sensor 55. Alternatively, a piece of foam, dispensed gel or glue could also be used to replace the use of a rubber sheet 551.

Since each hybrid DA key switch has a mechanically isolated first printed circuit board PCB1 configured underside independently, and each first printed circuit board PCB1 is separated by the cell walls 542 of each through cell 541 among the key frame 54, and hence mechanical cross-talk between adjacent DA key switches can be minimized.

When the key switch is at a depressed position, the two metal spring electrodes 571, 572 are closed, i.e. the circuit is shorted, at this moment, the Digital Signal is "on", and the Analog Signal is an Operating Signal.

Figure 8:
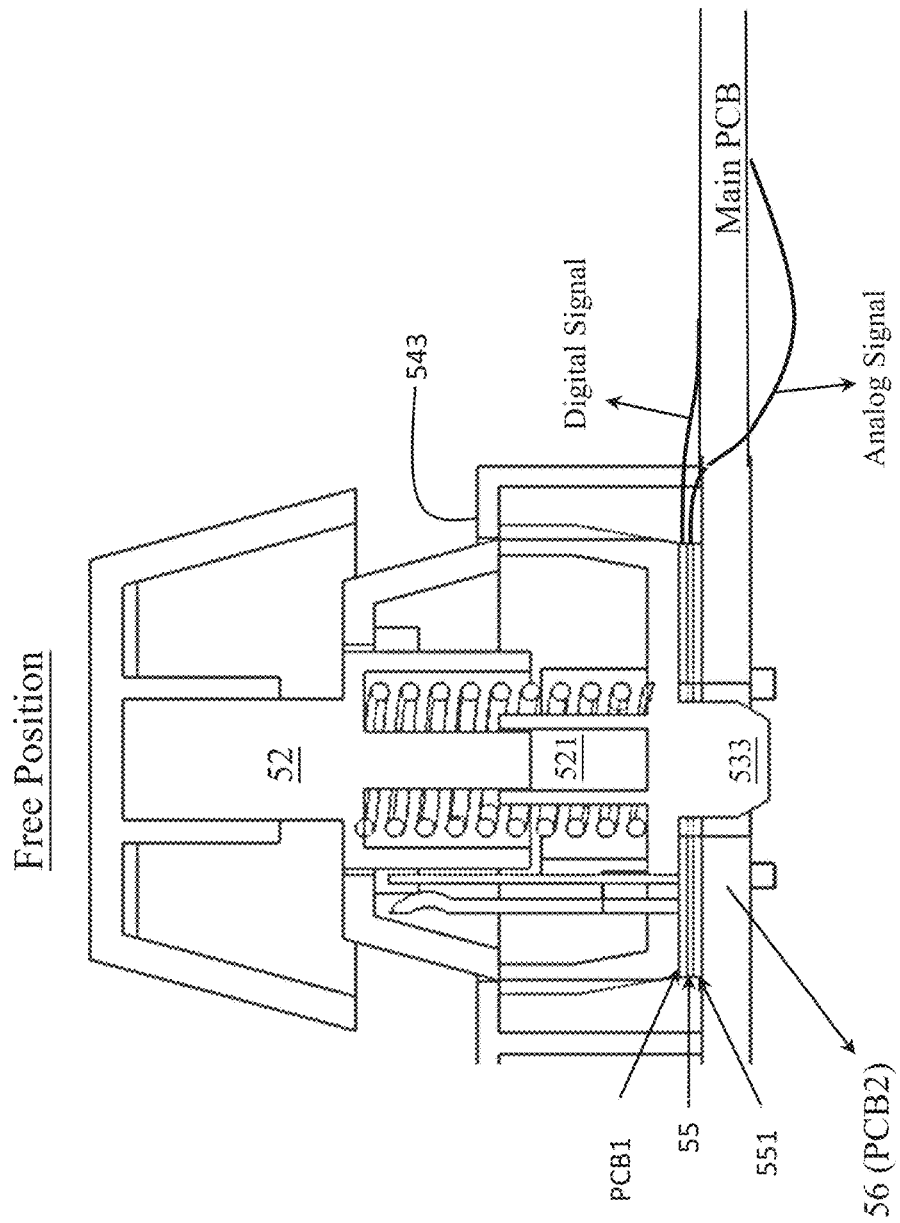
FIG. 8 shows a second printed circuit board PCB2 configured on a bottom side of the plurality of hybrid DA key switches according to the present invention.

FIG. 8 shows a second printed circuit board PCB2 configured on a bottom side of the plurality of hybrid DA key switches according to the present invention.

FIG. 8 shows a second printed circuit board PCB2, which can be a hard board, configured on a bottom side of the plurality of hybrid DA key switches.

Each individual first printed circuit board PCB1 is electrically coupled to a control circuit (not shown) which can be configured on the second printed circuit board PCB2. Each individual force sensor 55 is also electrically coupled to the control circuit (not shown).

Figure 9A:
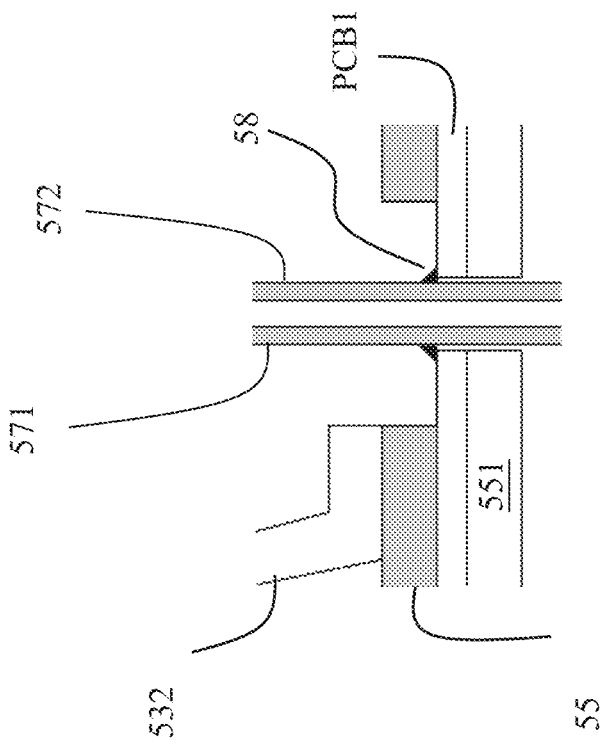
FIGS. 9A~9B show the metal spring electrodes in a through-hole soldering configuration.
Figure 9B:
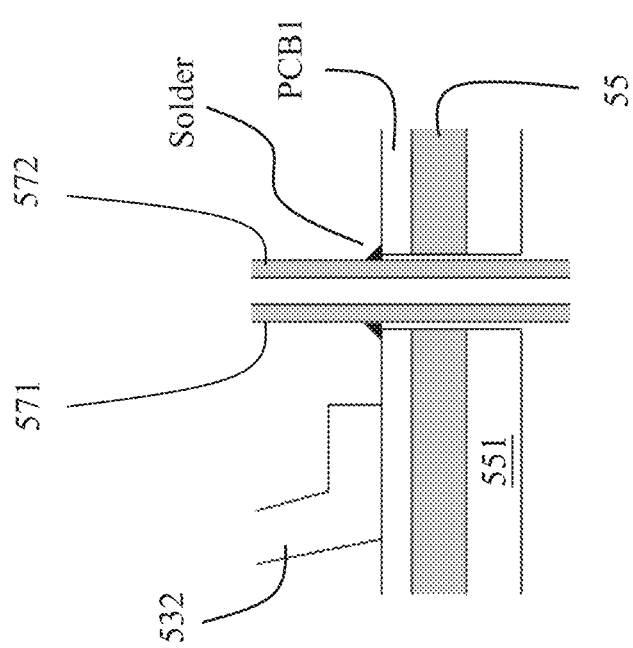

FIGS. 9A~9B show the metal spring electrodes in a through-hole soldering configuration.

FIG. 9A shows the pair of metal spring electrodes 571, 572 passing through the first printed circuit board PCB1, the force sensor 55, and the rubber sheet 551. Each of the metal spring electrodes 571, 572 is electrically coupled to the first printed circuit board PCB1 through soldering process with solder 58.

FIG. 9B shows the force sensor 55 is configured on a top side of the first printed circuit board PCB1. The force sensor 55 has a central opening 552 to make room for passing through of the two metal spring electrodes 571, 572.

Figure 10:
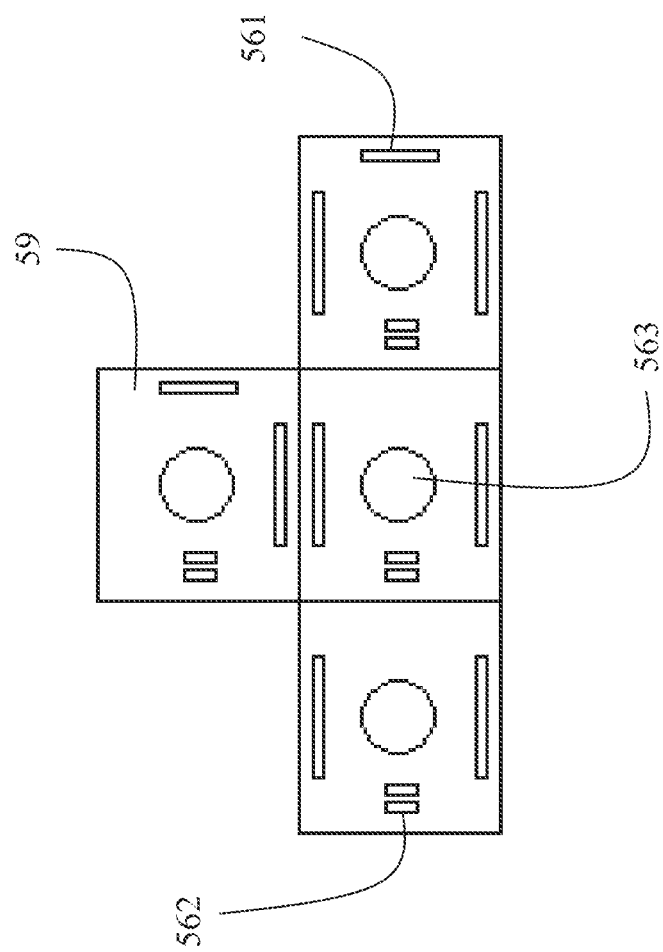
FIG. 10 shows a common substrate piezo sheet with multiple force sensors according to the present invention.

FIG. 10 shows a common substrate piezo sheet with multiple force sensors according to the present invention.

FIG. 10 shows a single piezo sheet 59 shared for the four key switches as an example, where the single substrate piezo sheet facilitates assembling job. A plurality of through holes are made for passing through of different elements; for example, a first plurality of through holes 561 are made for fastening buckles 544 to pass through; a second plurality of through holes 562 are made for metal spring electrodes 571, 572 to pass through, and a third plurality of through holes 563 are made for bottom protrusions 533 to pass through.

While several embodiments have been described by way of example, it will be apparent to those skilled in the art that various modifications may be configured without departs from the spirit of the present invention. Such modifications are all within the scope of the present invention, as defined by the appended claims.

NUMERICAL SYSTEM 51 key cap
52 key stem
521 central axis
522 sleeve
523 coil spring
525 circular wall
526 nonconductive separator
53 key module
531 key module cover
532 key module base
533 bottom protrusion
54 key frame
541 through cell
542 cell wall
543 top ledge
544 fastening buckle
55 force sensor
551 rubber sheet
552 central opening
56 support plate
561 through hole
562 through hole
563 through hole
571 spring electrode
572 spring electrode
59 piezo sheet
PCB1 first circuit board
PCB2 second circuit board

What is claimed is:

1. A key switch for generating both a digital signal and an analog signal, the key switch comprising:
   a key module;
   a key stem configured to move up and down relative to the key module, wherein
      the key stem has a top portion and a bottom portion,
      the top portion projects upward from a top side of the key module,
      the bottom portion is inside the key module,
      in a first state, the key stem is in an upper position when the key switch is not depressed, and
      in a second state, the key stem is in a lower position when the key switch is depressed;
   a first electrode and a second electrode movable relative to each other in accordance with up and down movement of the key stem relative to the key module, wherein
      in the first state of the key stem, the first and second electrodes are separated from each other, and
      in the second state of the key stem, the first and second electrodes are in physical and electrical contact to generate a digital signal; and
   a force sensor under a bottom side of the key module, wherein
      when the key stem is depressed and moves downward away from the first state, the key module is pressed against the force sensor and causes the force sensor to generate an analog signal corresponding to a magnitude of a force at which the key stem is depressed.

2. The key switch as claimed in claim 1, wherein the key module further comprises a key module cover and a key module base.

3. The key switch as claimed in claim 2, further comprising:
   a key frame having a plurality of cells, each cell accommodating a corresponding key module.

4. The key switch as claimed in claim 3, wherein each cell has cell walls enclosing a space to house the corresponding key module.

5. The key switch as claimed in claim 4, further comprising:
   a plurality of top ledges, each top ledge on a top side of a corresponding cell wall; and a support plate under the bottom side of the key module, wherein the top ledge brackets the key module in a vertical direction to keep the key module fixed on the support plate.

6. The key switch as claimed in claim 1, further comprising:

a support plate under the bottom side of the key module, wherein the key module is attached to the support plate, the force sensor is between the bottom side of the key module and the support plate, and the key module presses against the force sensor when the key switch is depressed.

7. The key switch as claimed in claim 6, further comprising:

a circuit board between the bottom side of the key module and the support plate, wherein the first and second electrodes have bottom portions attached to the circuit board, the first and second electrodes extend upwardly from the circuit board into the key module in which top portions of the first and second electrodes are arranged, and the top portions of the first and second electrodes are movable toward and away from each other in accordance with the up and down movement of the key stem relative to the key module.

8. The key switch as claimed in claim 7, wherein the circuit board is above the force sensor, and is arranged between the bottom side of the key module and the force sensor.

9. The key switch as claimed in claim 7, wherein the circuit board is under the force sensor, and the force sensor is arranged between the bottom side of the key module and the circuit board.

10. The key switch as claimed in claim 7, wherein the circuit board has metal contacts electrically coupled to the bottom portions of the first and second electrodes.

11. The key switch as claimed in claim 10, further comprising:

a key cap mounted on the top portion of the key stem.

12. The key switch as claimed in claim 10, wherein the circuit board has a through hole through which the first and second electrodes extend.

13. The key switch as claimed in claim 7, wherein the key module further comprises a bottom protrusion projecting downward from the bottom side of the key module to attach the key module to the support plate.

14. The key switch as claimed in claim 13, wherein the circuit board, the force sensor and the support plate having a common through hole for the bottom protrusion to pass through.

15. The key switch as claimed in claim 14, wherein the circuit board has metal contacts electrically coupled to the bottom portions of the first and second electrodes.

16. The key switch as claimed in claim 15, wherein the circuit board is under the force sensor, and the force sensor has a first through hole exposing an area of the circuit board, and the first electrode and the second electrode extend through the first through hole of the force sensor to electrically couple to the circuit board.

17. The key switch as claimed in claim 16, further comprising:

a key cap mounted on the top portion of the key stem.

18. The key switch as claimed in claim 7, further comprising:

a non-conductive separator on an outside surface of the bottom portion of the key stem, wherein in the first state of the key stem, the non-conductive separator physically and electrically separates the top portions of the first and second electrodes from each other, and in the second state of the key stem, the non-conductive separator moves downward together with the key stem to cause the top portions of the first and second electrodes to physically and electrically contact to generate the digital signal.

19. The key switch as claimed in claim 6, further comprising:

a rubber sheet arranged on a top surface of the support plate.

20. The key switch as claimed in claim 1, further comprising:

a common substrate piezo sheet defining a plurality of the force sensors each for a corresponding key module.

21. The key switch as claimed in claim 1, wherein in response to a single depression of the key stem from the first state to the second state, both the digital signal and the analog signal are generated.

* * * * *